(12) United States Patent
Ge

(10) Patent No.: US 9,798,202 B2
(45) Date of Patent: Oct. 24, 2017

(54) FFS MODE ARRAY SUBSTRATE WITH TFT CHANNEL LAYER AND COMMON ELECTRODE LAYER PATTERNED FROM A SINGLE SEMICONDUCTOR LAYER AND MANUFACTURING METHOD THEREOF

(71) Applicant: SHENZHEN CHINA STAR OPTOELECTRONICS TECHNOLOGY CO., LTD., Guangdong (CN)

(72) Inventor: Shimin Ge, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/116,229

(22) PCT Filed: Apr. 8, 2016

(86) PCT No.: PCT/CN2016/078754
§ 371 (c)(1),
(2) Date: Aug. 3, 2016

(65) Prior Publication Data
US 2017/0261797 A1    Sep. 14, 2017

(30) Foreign Application Priority Data
Mar. 11, 2016    (CN) .......................... 2016 1 0141051

(51) Int. Cl.
*H01L 27/12* (2006.01)
*G02F 1/1343* (2006.01)
(Continued)

(52) U.S. Cl.
CPC ........ *G02F 1/13439* (2013.01); *G02F 1/1368* (2013.01); *G02F 1/133345* (2013.01);
(Continued)

(58) Field of Classification Search
CPC . H01L 27/124; H01L 27/1255; H01L 27/127; G02F 1/134345;
(Continued)

(56) References Cited

U.S. PATENT DOCUMENTS

| 6,762,813 | B1 * | 7/2004 | Zhang | ............... | G02F 1/134363 |
| | | | | | 349/141 |
| 2002/0001867 | A1 * | 1/2002 | Sung | ................. | G02F 1/134363 |
| | | | | | 438/30 |

(Continued)

OTHER PUBLICATIONS

Hatsumi et al., "FFS-mode OS-LCD for reducing eye strain", Journal of the SID 21/10, Jan. 2014, pp. 442-450.*

(Continued)

*Primary Examiner* — Evan Pert
(74) *Attorney, Agent, or Firm* — Mark M. Friedman

(57) ABSTRACT

An FFS mode array substrate and a manufacturing method thereof are provided. The FFS mode array substrate has: a glass substrate provided with a gate electrode thereon; a first insulation layer; a semiconductor layer having a channel region and a common electrode region to form a channel semiconductor layer on the channel region of the semiconductor layer, and form a common electrode layer on the common electrode region of the semiconductor layer by doping semiconductor thereon; and a second insulation layer provided with a first through hole and a second through hole therein.

11 Claims, 4 Drawing Sheets

(51) Int. Cl.
*G02F 1/1368* (2006.01)
*G02F 1/1362* (2006.01)
*G02F 1/1333* (2006.01)
*H01L 29/786* (2006.01)

(52) U.S. Cl.
CPC .... *G02F 1/136227* (2013.01); *H01L 29/7869* (2013.01); *H01L 29/78606* (2013.01); *G02F 2001/134372* (2013.01); *G02F 2001/136236* (2013.01); *G02F 2201/121* (2013.01); *G02F 2202/10* (2013.01); *G02F 2202/16* (2013.01)

(58) Field of Classification Search
CPC ........ G02F 2001/134372; G02F 2001/134345; G02F 1/134309
See application file for complete search history.

(56) References Cited

U.S. PATENT DOCUMENTS

| | | | |
|---|---|---|---|
| 2007/0059855 A1* | 3/2007 | Shih | G02F 1/134363 438/30 |
| 2007/0254415 A1* | 11/2007 | Oh | H01L 27/1255 438/149 |
| 2010/0044716 A1* | 2/2010 | Lo | G02F 1/133555 257/72 |
| 2010/0075451 A1* | 3/2010 | Yoo | H01L 27/1218 438/34 |
| 2011/0156165 A1* | 6/2011 | Jang | G02F 1/136213 257/389 |
| 2013/0162926 A1* | 6/2013 | Kwack | H01L 27/1248 349/43 |
| 2015/0303123 A1* | 10/2015 | Choi | H01L 23/3192 257/72 |
| 2016/0351595 A1* | 12/2016 | Dai | G02F 1/133512 |
| 2017/0054029 A1* | 2/2017 | Koezuka | H01L 29/7869 |

OTHER PUBLICATIONS

Xu et al., "A Fringe Field Switching Liquid Crystal Display With Fast Grayscale Response Time", Journal of Display Technology, vol. II, No. 4, Apr. 2015, pp. 353-359.*

* cited by examiner

FFS MODE ARRAY SUBSTRATE WITH TFT CHANNEL LAYER AND COMMON ELECTRODE LAYER PATTERNED FROM A SINGLE SEMICONDUCTOR LAYER AND MANUFACTURING METHOD THEREOF

FIELD OF THE INVENTION

The present invention relates to a display field, and more particularly to a FFS (Fringe Field Switching) mode array substrate and a manufacturing method thereof.

BACKGROUND OF THE INVENTION

Liquid crystal display (LCD) technology driven by an active array uses a dual-polarization characteristic to control an arrangement direction of liquid crystal molecules by applying an electric field, so as to carry out a switching control for an optical path travel direction of a backlight source. According to different electric field applying directions to the liquid crystal molecules, the LCD display mode is divided into a TN (Twist Nematic) series mode, a VA (Vertical Alignment) series mode, and an IPS (In-Plane Switching) series mode. The VA series mode is to apply a longitudinal electric field to the liquid crystal molecules, and the IPS series mode is to apply a transverse electric field to the liquid crystal molecules. In the IPS series mode, according to different applying transverse electric fields, it is further divided into an IPS mode and an FFS mode, etc. Each of the pixel units of the FFS display mode has an upper layer electrode and a lower layer electrode, namely a pixel electrode and a common electrode, and the lower layer common electrode is laid with an entire surface method in an aperture region. The FFS display mode has the advantages of: high penetration ratio, large viewing angle, and lower color shift, so that it has become a widely applied LCD display technology.

For improving the stability of an oxide TFT (thin film transistor), an etch stop layer (ESL) structure has been widely adopted, and the structure can efficaciously decrease influences for back channels from external environment factors and etching damage of source and drain electrodes. However, a manufacturing method of a traditional FFS display mode with the ESL structure requires an increased number of masks, so that the process complexity and the manufacturing cost are increased.

SUMMARY OF THE INVENTION

The object of the present invention is to provide an FFS mode array substrate and a manufacturing method thereof, so as to solve a technical problem: in the conventional technology, a manufacturing method of a traditional FFS display mode with an ESL structure requires an increased number of masks, so that the process complexity and the manufacturing cost are increased.

For solving the above-mentioned problem, the present invention provides technical solutions as follows:

One embodiment of the present invention provides a manufacturing method of an FFS mode array substrate, which comprises steps of:
forming a gate electrode on a glass substrate;
depositing a first insulation layer and a semiconductor layer on the glass substrate and the gate electrode, in order, wherein the semiconductor layer is provided with a channel region, a common electrode region, and a third spacing region located between the channel region and the common electrode region;
coating a second photoresist layer on the semiconductor layer, and removing photoresist of the second photoresist layer which corresponds to the third spacing region;
etching the semiconductor layer to form a channel semiconductor layer on the channel region of the semiconductor layer and to form a to-be-doped semiconductor layer on the common electrode region of the semiconductor layer;
removing the second photoresist layer which is on the to-be-doped semiconductor layer, and doping the to-be-doped semiconductor layer to form a common electrode layer;
removing the second photoresist layer which is on the channel semiconductor layer; and
depositing a second insulation layer on the channel semiconductor layer, the common electrode layer and the first insulation layer, and forming a first through hole and a second through hole which are used to expose the channel semiconductor layer.

The manufacturing method of the FFS mode array substrate according to the present invention further comprises steps of:
depositing a pixel electrode layer on the second insulation layer, wherein the pixel electrode layer is provided with a plurality of pixel electrode regions and first spacing regions located between each two of the pixel electrode regions;
depositing a first metal layer on the pixel electrode layer, wherein the first metal layer is provided with a source electrode region, a drain electrode region, and a second spacing region located between the source electrode region and the drain electrode region;
coating a first photoresist layer on the first metal layer, and removing photoresist of the first photoresist layer which corresponds to the first spacing regions and the second spacing regions;
etching the first metal layer and the pixel electrode layer to respectively form a source electrode and a drain electrode in the source electrode region and the drain electrode region of the first metal layer, and to form a plurality of pixel electrodes in the pixel electrode regions of the pixel electrode layer;
removing the first photoresist layer, and removing the first metal layer which is on the pixel electrodes; and
depositing a third insulation layer on the source electrode, the drain electrode, the pixel electrodes, and the second insulation layer.

In the manufacturing method of the FFS mode array substrate according to the present invention, two doped regions which respectively correspond to the first through hole and the second through hole are disposed on the channel semiconductor layer, and the step of removing the second photoresist layer which is on the channel semiconductor layer includes: removing the second photoresist layer which is on the two doped regions of the channel semiconductor layer; doping the two doped regions to transform semiconductor of the regions into conductors; and then removing the rest second photoresist layer on the channel semiconductor layer.

In the manufacturing method of the FFS mode array substrate according to the present invention, the second insulation layer and the third insulation layer both include silicon nitride or silica.

In the manufacturing method of the FFS mode array substrate according to the present invention, the channel semiconductor layer includes indium gallium zinc oxide.

In the manufacturing method of the FFS mode array substrate according to the present invention, the pixel electrode layer is an indium tin oxide transparent electrode layer or an indium zinc oxide transparent electrode layer, and a thickness of the pixel electrode layer is in a range from 10 to 100 nanometers.

The present invention further provides a manufacturing method of an FFS mode array substrate, which comprises steps of:

forming a gate electrode on a glass substrate;

depositing a first insulation layer and a semiconductor layer on the glass substrate and the gate electrode, in order, wherein the semiconductor layer is provided with a channel region, a common electrode region, and a third spacing region located between the channel region and the common electrode region;

coating a second photoresist layer on the semiconductor layer, and removing photoresist of the second photoresist layer which corresponds to the third spacing region;

etching the semiconductor layer to form a channel semiconductor layer on the channel region of the semiconductor layer and to form a to-be-doped semiconductor layer on the common electrode region of the semiconductor layer;

removing the second photoresist layer which is on the to-be-doped semiconductor layer, and doping the to-be-doped semiconductor layer to form a common electrode layer;

removing the second photoresist layer which is on the channel semiconductor layer, depositing a second insulation layer on the channel semiconductor layer, the common electrode layer and the first insulation layer, and forming a first through hole and a second through hole which are used to expose the channel semiconductor layer;

depositing a pixel electrode layer on the second insulation layer, wherein the pixel electrode layer is provided with a plurality of pixel electrode regions and first spacing regions located between each two of the pixel electrode regions;

depositing a first metal layer on the pixel electrode layer, wherein the first metal layer is provided with a source electrode region, a drain electrode region, and a second spacing region located between the source electrode region and the drain electrode region;

coating a first photoresist layer on the first metal layer, and removing photoresist of the first photoresist layer which corresponds to the first spacing regions and the second spacing regions;

etching the first metal layer and the pixel electrode layer to respectively form a source electrode and a drain electrode in the source electrode region and the drain electrode region of the first metal layer, and to form a plurality of pixel electrodes in the pixel electrode regions of the pixel electrode layer;

removing the first photoresist layer, and removing the first metal layer which is on the pixel electrodes; and depositing a third insulation layer on the source electrode, the drain electrode, the pixel electrodes and the second insulation layer;

wherein the second insulation layer and the third insulation layer both include silicon nitride or silica.

The present invention further provides an FFS mode array substrate, which comprises:

a glass substrate provided with a gate electrode thereon;
a first insulation layer formed on the glass substrate and the gate electrode;
a semiconductor layer formed on the first insulation layer, wherein the semiconductor layer includes a channel region and a common electrode region;
the channel region of the semiconductor layer forms a channel semiconductor layer; and semiconductor of the common electrode region of the semiconductor layer is doped to form a common electrode layer; and
a second insulation layer deposited on the channel semiconductor layer, the common electrode layer and the first insulation layer, wherein a first through hole and a second through hole exposing the channel semiconductor layer are formed in the second insulation layer.

In the FFS mode array substrate according to the present invention, that further comprises:

a pixel electrode layer deposited on the second insulation layer, wherein the pixel electrode layer is provided with a plurality of pixel electrodes;
a source electrode and a drain electrode formed on the pixel electrode layer; and
a third Insulation layer formed on the source electrode, the drain electrode, the pixel electrodes and the second insulation layer.

In the FFS mode array substrate according to the present invention, the channel semiconductor layer includes indium gallium zinc oxide.

In the FFS mode array substrate according to the present invention, the pixel electrode layer is an indium tin oxide transparent electrode layer or an indium zinc oxide transparent electrode layer, and a thickness of the pixel electrode layer is in a range from 10 to 100 nanometers.

The present invention further provides an FFS mode array substrate, comprising:

a glass substrate provided with a gate electrode thereon;
a first insulation layer formed on the glass substrate and the gate electrode;
a semiconductor layer formed on the first insulation layer, wherein the semiconductor layer includes a channel region and a common electrode region;
the channel region of the semiconductor layer forms a channel semiconductor layer; and semiconductor of the common electrode region of the semiconductor layer is doped to form a common electrode layer;
a second insulation layer deposited on the channel semiconductor layer, the common electrode layer and the first insulation layer, wherein a first through hole and a second through hole exposing the channel semiconductor layer are formed in the second insulation layer;
a pixel electrode layer deposited on the second insulation layer, wherein the pixel electrode layer is provided with a plurality of pixel electrodes;
a source electrode and a drain electrode formed on the pixel electrode layer; and
a third insulation layer formed on the source electrode, the drain electrode, the pixel electrodes and the second insulation layer;
wherein the second insulation layer and the third insulation layer both include silicon nitride or silica.

In the present invention, by forming the channel semiconductor layer 13 and the common electrode layer 15 in the same layer, they can be formed by using a single mask, and the common electrode layer 15 can be formed by doping the common electrode region of the semiconductor layer, so that it further shortens the process and improves the manufacturing efficiency.

DETAILED DESCRIPTION OF THE PREFERRED EMBODIMENTS

Figure 1:
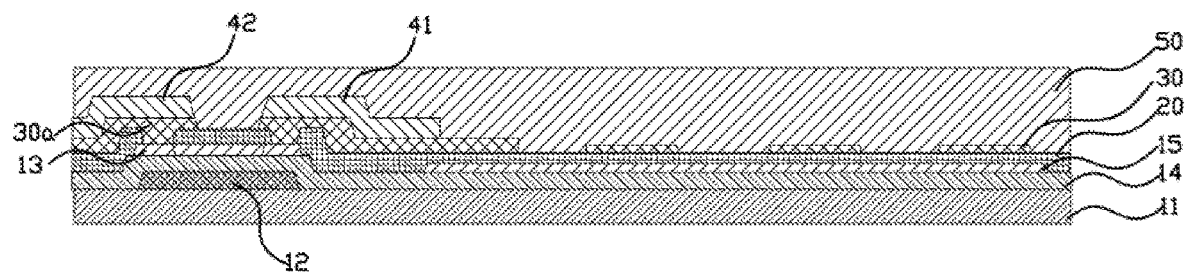
FIG. 1 is a schematic structural view of an FFS mode array substrate according to a preferred embodiment of the present invention.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto.

In the drawings, units with similar structures use the same numerals.

Refer now to FIG. 1, which is a schematic structural view of an FFS mode array substrate according to a preferred embodiment of the present invention. An FFS mode array substrate according to the preferred embodiment comprises: a glass substrate 11, a gate electrode 12, a semiconductor layer (not labeled in FIG. 1), a first insulation layer 14, a second insulation layer 20, a pixel electrode layer 30, a source electrode 41, a drain electrode 42, and a third insulation layer 50, wherein the glass substrate 11, the gate electrode 12, the semiconductor layer (not labeled in FIG. 1), and the first Insulation layer 14 are composed into a base layer.

Specifically, the gate electrode 12 is formed on the glass substrate 11; the first insulation layer 14 is formed on the glass substrate 11 and the gate electrode 12; and the semiconductor layer is formed on the first insulation layer 14. In the embodiment, the semiconductor layer is provided with a channel region, a common electrode region, and a third spacing region (not labeled) located between the channel region and the common electrode region. The channel region is used to form a channel semiconductor layer 13 of a thin film transistor, and the channel semiconductor layer 13 is located above the gate electrode 12. The semiconductor layer in the common electrode region is used to form a common electrode layer 15 by a doping process. The semiconductor layer in the third spacing region is removed by a photoetching process.

The second insulation layer 20 is formed on the first insulation layer 14, the common electrode layer 15, and the channel semiconductor layer 13. A first through hole and a second through hole which are used to expose the channel semiconductor layer 13 are formed in the second insulation layer 20 by a photoetching process. The pixel electrode layer 30 is formed on the second insulation layer 20, and the pixel electrode layer 30 is provided with contact portions 30a located in a thin film transistor region and a plurality of pixel electrodes located beside the thin film transistor region, wherein the contact portions 30a contact with the channel semiconductor layer 13 through the first through hole and the second through hole. The source electrode 41 and the drain electrode 42 are both formed on the contact portions 30a of the pixel electrode layer 30, and are electrically connected with the channel semiconductor layer 13 by the contact portions 30a. The third insulation layer 50 is formed on the second insulation layer 20, the source electrode 41, the drain electrode 42, and the pixel electrode layer 30.

The semiconductor layer adopts an indium gallium zinc oxide (IGZO), namely the channel semiconductor layer 13 adopts the indium gallium zinc oxide (IGZO), but it is not limited thereto.

The first insulation layer 14 is made of silicon nitride and/or silica, which is mainly used to separate the gate electrode 12 from the common electrode layer 15. The thickness of the first insulation layer 14 is in a range from 100 to 300 nanometers.

The second insulation layer 20 is made of silicon nitride and/or silica, which is mainly used to separate the pixel electrode layer 30 from the common electrode layer 15. The thickness of the second insulation layer 20 is in a range from 50 to 150 nanometers.

The third insulation layer 50 is made of silicon nitride, which is a flat layer in the embodiment and mainly used to protect the pixel electrodes, the source electrode 41, and the drain electrode 42.

The pixel electrode layer 30 is an indium tin oxide (ITO) transparent electrode layer or an indium zinc oxide (IZO) transparent electrode layer, and the thickness thereof is in a range from 10 to 100 nanometers.

Additionally, in the embodiment, two doped regions which respectively correspond to the first through hole and the second through hole are disposed on the channel semiconductor layer 13. The doped regions of the channel semiconductor layer 13 are doped, so that semiconductor of the regions is transformed into conductor, so as to decrease an impedance effect of the channel semiconductor layer 13.

In the embodiment, the source electrode 41 and the drain electrode 42 are formed on the pixel electrode layer 30, so that in the manufacturing process, the source electrode 41, the drain electrode 42, and the pixel electrodes can be simultaneously formed by using a single mask, and therefore it has beneficial effects to shorten the process and improve the manufacturing efficiency.

Additionally, by forming the channel semiconductor layer 13 and the common electrode layer 15 in the same layer, they can be formed by using a single mask, and the common electrode layer 15 can be formed by doping the common electrode region of the semiconductor layer, so that it further shortens the process and improves the manufacturing efficiency.

Figure 2:
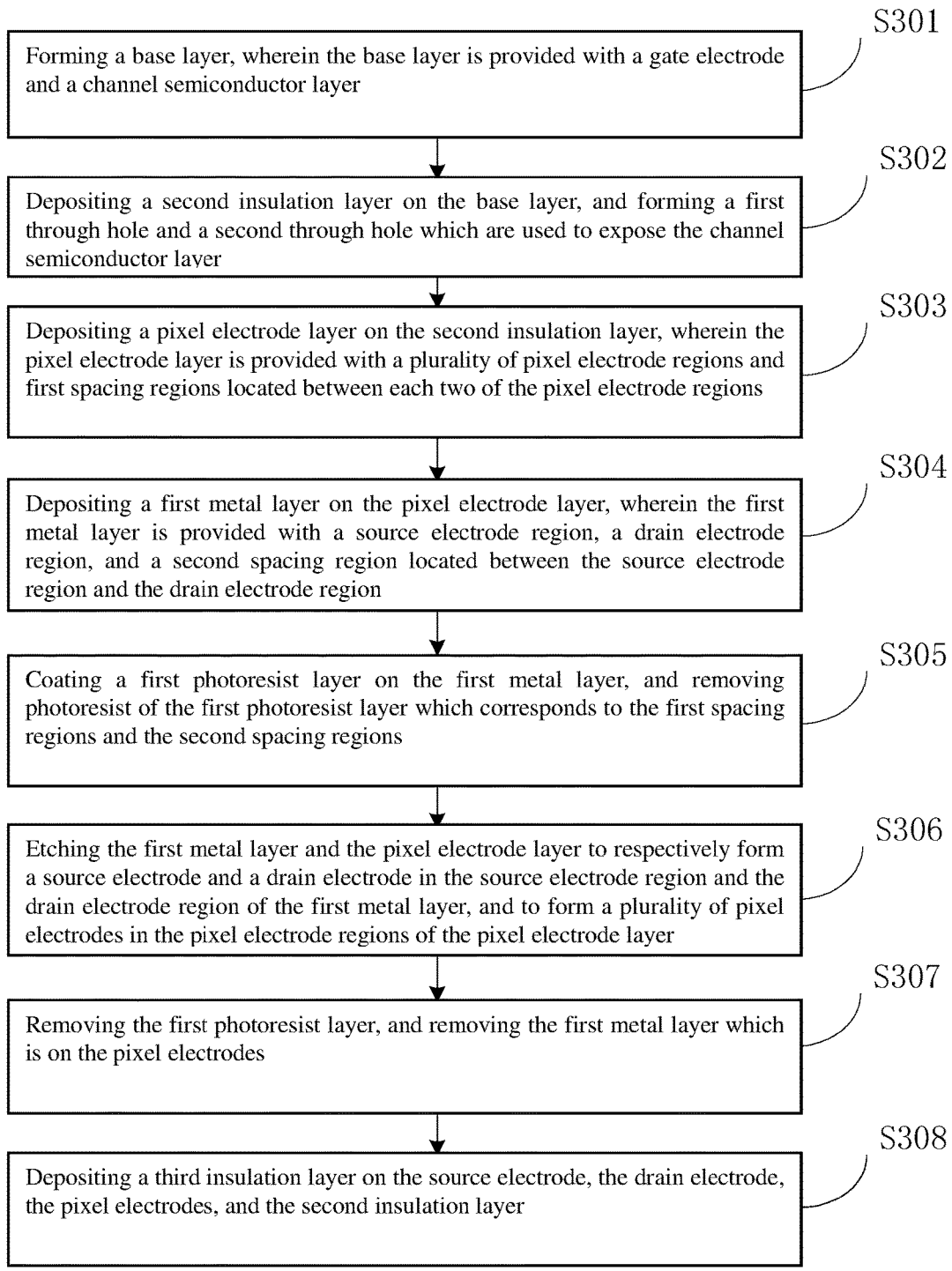
FIG. 2 is a flow chart of a manufacturing method of the FFS mode array substrate according to the preferred embodiment of the present invention.

Refer now to FIG. 2, which is a flow chart of a manufacturing method of the FFS mode array substrate according to the preferred embodiment of the present invention. The manufacturing method comprises following steps of:

S301: forming a base layer, wherein the base layer is provided with a gate electrode and a channel semiconductor layer;

S302: depositing a second insulation layer on the base layer, and forming a first through hole and a second through hole which are used to expose the channel semiconductor layer;

S303: depositing a pixel electrode layer on the second insulation layer, wherein the pixel electrode layer is provided with a plurality of pixel electrode regions and first spacing regions located between each two of the pixel electrode regions;

S304: depositing a first metal layer on the pixel electrode layer, wherein the first metal layer is provided with a source electrode region, a drain electrode region, and a second spacing region located between the source electrode region and the drain electrode region;

S305: coating a first photoresist layer on the first metal layer, and removing photoresist of the first photoresist layer which corresponds to the first spacing regions and the second spacing regions;

S306: etching the first metal layer and the pixel electrode layer to respectively form a source electrode and a drain electrode in the source electrode region and the drain electrode region of the first metal layer, and to form a plurality of pixel electrodes in the pixel electrode regions of the pixel electrode layer;

S307: removing the first photoresist layer, and removing the first metal layer which is on the pixel electrodes; and S308: depositing a third insulation layer on the source electrode, the drain electrode, the pixel electrodes, and the second insulation layer.

The above-mentioned steps are described in detail below by referring FIGS. 3A-3I.

In the step S301, which specifically includes following sub steps of:

S31: forming the gate electrode on a glass substrate;

S32: depositing a first insulation layer and a semiconductor layer on the glass substrate and the gate electrode, in order, wherein the semiconductor layer is provided with a channel region, a common electrode region, and a third spacing region located between the channel region and the common electrode region;

S33: coating a second photoresist layer on the semiconductor layer, and removing photoresist of the second photoresist layer which corresponds to the third spacing region;

S34: etching the semiconductor layer to form the channel semiconductor layer on the channel region of the semiconductor layer and to form a to-be-doped semiconductor layer on the common electrode region of the semiconductor layer;

S35: removing the second photoresist layer which is on the to-be-doped semiconductor layer, and doping the to-be-doped semiconductor layer to form a common electrode layer; and S36: removing the second photoresist layer which is on the channel semiconductor layer.

The second insulation layer is deposited on the channel semiconductor layer, the common electrode layer, and the first insulation layer.

Figure 3A:
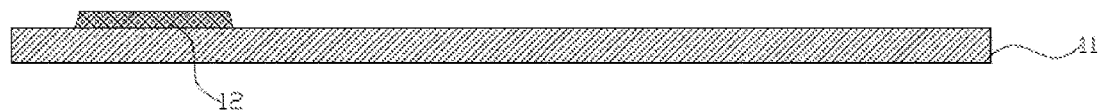
FIGS. 3A-3I are schematic manufacturing views of the manufacturing method of the FFS mode array substrate according to the preferred embodiment of the present invention.

In the step S31, as shown in FIG. 3A, the material of the gate electrode 12 is selected from a group consisting of molybdenum (Mo), titanium (Ti), aluminum (Al), copper (Cu), or any stack combination thereof, and is deposited and formed by a method of physical vapor deposition (PVD). The step S32 follows thereafter.

Figure 3B:
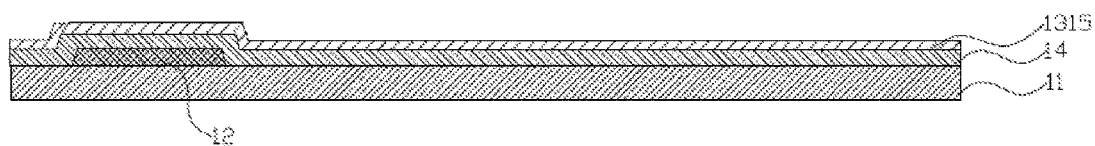

In the step S32, as shown in FIG. 3B, the first insulation layer 14 is made of silicon nitride and/or silica, and is deposited and formed by a method of chemical vapor deposition (CVD), and is mainly used to separate the gate electrode 12 from the common electrode layer 15. The thickness of the first insulation layer 14 is in a range from 100 to 300 nanometers. The semiconductor layer 1315 adopts an indium gallium zinc oxide (IGZO), and is deposited and formed by a method of physical vapor deposition (PVD). The semiconductor layer is divided into a channel region 1A, a common electrode region 1B, and a third spacing region 1C located between the channel region 1A and the common electrode region 1B. The step S33 follows thereafter.

Figure 3C:
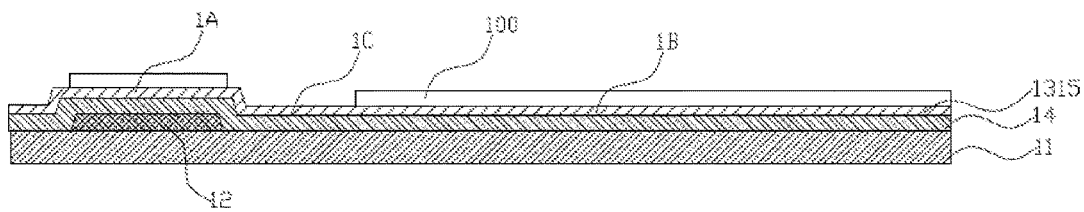

In the step S33, as shown in FIG. 3C, the second photoresist layer 100 is processed by a half tone mask process (HTM) or a gray tone mask process (GTM), so as to remove photoresist of the second photoresist layer which corresponds to the third spacing region. The step S34 follows thereafter.

Figure 3D:
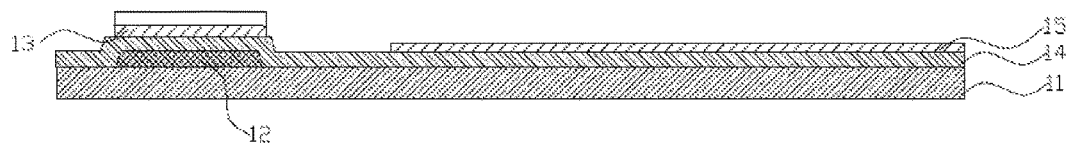

In the step S34, as shown in FIG. 3D, when etching the semiconductor layer 1315, a dry etching or a wet etching can be adopted. In the step S35, when doping the to-be-doped semiconductor layer to form the common electrode layer 15, a plasma treatment process with hydrogen (H) or helium (He) can be adopted. The step S36 follows thereafter.

Figure 3E:
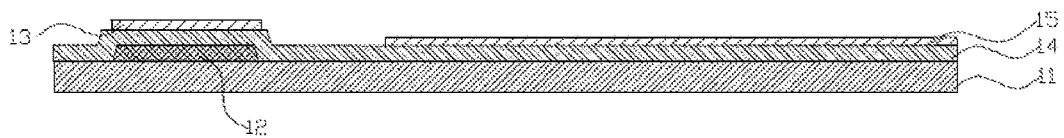

In the step S36, as shown in FIG. 3E, when removing the second photoresist layer 100 from the channel semiconductor layer 13, a photoresist oxidized method can be adopted. The step S302 follows thereafter.

Figure 3F:
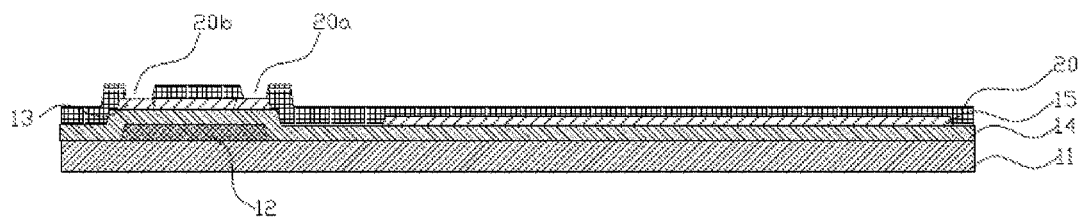

In the step S302, as shown in FIG. 3F, when depositing the second insulation layer on the channel semiconductor layer, the common electrode layer, and the first insulation layer of the base layer, the second insulation layer is made of silicon nitride and/or silica, and mainly used to separate the pixel electrode layer 30 from the common electrode layer 15. The thickness of the second insulation layer 20 is in a range from 50 to 150 nanometers. The first through hole 20a and the second through hole 20b expose the channel semiconductor layer, respectively. The step S303 follows thereafter.

Figure 3G:
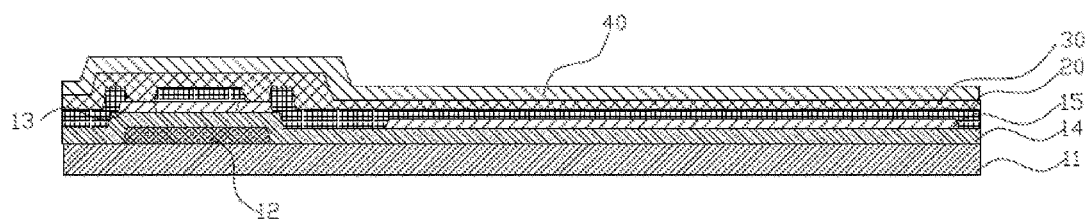
Figure 3H:
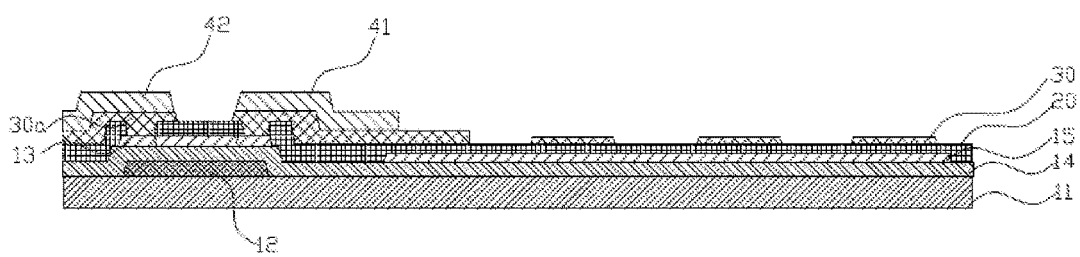

In the step S303, as shown in FIG. 3G, the pixel electrode layer is an indium tin oxide (ITO) transparent electrode layer or an indium zinc oxide (IZO) transparent electrode layer, and the thickness thereof is in a range from 10 to 100 nanometers. In the step S304, the first metal layer 40 is deposited and formed by a method of physical vapor deposition (PVD). The step S305 follows thereafter.

In the step S305, by a half tone mask process (HTM) or a gray tone mask process (GTM), the second photoresist layer is processed and the photoresist of the second photoresist layer which corresponds to the third spacing region is removed.

In the step S306, when etching the first metal layer 40 and the pixel electrode layer 30, a wet etching process can be adopted, so as to respectively form the source electrode 41 and the drain electrode 42, and to form the pixel electrodes in the pixel electrode regions of the pixel electrode layer 30.

In the step S307, when removing the first photoresist layer, a method is to oxidize and then remove it. When removing the first metal layer 40, a common technology can be adopted, so it does not give unnecessary details. After removing the first metal layer, the structure is like FIG. 3H. The step S308 follows thereafter.

Figure 3I:
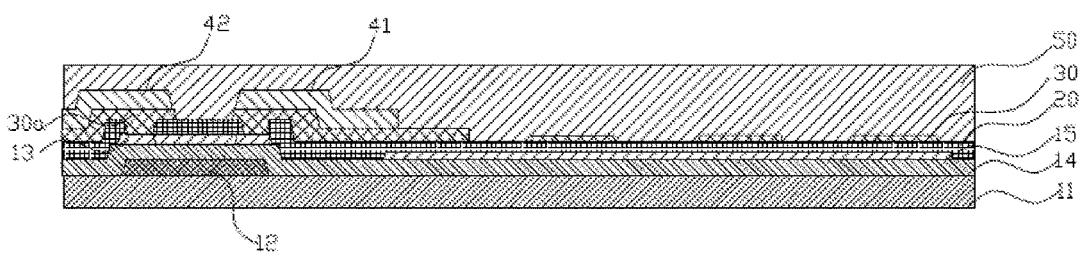

In the step S308, as shown in FIG. 3I, the third insulation layer 50 is made of silicon nitride, which is a flat layer in the embodiment, and mainly used to protect the pixel electrodes, the source electrode 41, and the drain electrode 42.

Additionally, in the embodiment, two doped regions which respectively correspond to the first through hole 20a and the second through hole 20b are disposed on the channel semiconductor layer 13. The step S36 includes:

Removing the second photoresist layer which is on the two doped regions of the channel semiconductor layer; doping the two doped regions, so that the semiconductor of the regions is transformed into conductors, so as to decrease an impedance effect of the channel semiconductor layer; and then removing the rest second photoresist layer on the channel semiconductor layer. By this step, an impedance of the channel semiconductor layer can be decreased.

In the embodiment, the source electrode 41 and the drain electrode 42 are formed on the pixel electrode layer 30, so that in the manufacturing process, the source electrode 41, the drain electrode 42, and the pixel electrodes can be simultaneously formed by using a single mask, and therefore it has beneficial effects to shorten the process and improve the manufacturing efficiency.

Additionally, by forming the channel semiconductor layer 13 and the common electrode layer 15 in the same layer, they can be formed by using a single mask, and the common electrode layer 15 can be formed by doping the common electrode region of the semiconductor layer, so that it further shorten the process and improve the manufacturing efficiency.

The present invention has been described with preferred embodiments thereof and it is understood that many changes and modifications to the described embodiment can be carried out without departing from the scope and the spirit of the invention that is intended to be limited only by the appended claims.

What is claimed is:

1. A manufacturing method of a FFS (Fringe Field Switching) mode array substrate, comprising steps of:
    forming a gate electrode on a glass substrate;
    depositing a first insulation layer and a semiconductor layer on the glass substrate and the gate electrode in order, wherein the semiconductor layer has a channel region, a common electrode region, and a third spacing region located between the channel region and the common electrode region;
    coating a second photoresist layer on the semiconductor layer, and removing photoresist of the second photoresist layer which corresponds to the third spacing region;
    etching the semiconductor layer to form a channel semiconductor layer on the channel region of the semiconductor layer and to form a to-be-doped semiconductor layer on the common electrode region of the semiconductor layer;
    removing the second photoresist layer which is on the to-be-doped semiconductor layer, and doping the to-be-doped semiconductor layer to form a common electrode layer;
    removing the second photoresist layer which is on the channel semiconductor layer; and
    depositing a second insulation layer on the channel semiconductor layer, the common electrode layer and the first insulation layer, and forming a first through hole and a second through hole which are used to expose the channel semiconductor layer.

2. The manufacturing method of the FFS mode array substrate according to claim 1, further comprising steps of:
    depositing a pixel electrode layer on the second insulation layer, wherein the pixel electrode layer has a plurality of pixel electrode regions and first spacing regions located between each two of the pixel electrode regions;
    depositing a first metal layer on the pixel electrode layer, wherein the first metal layer has a source electrode region, a drain electrode region, and a second spacing region located between the source electrode region and the drain electrode region;
    coating a first photoresist layer on the first metal layer, and removing photoresist of the first photoresist layer which corresponds to the first spacing regions and the second spacing regions;
    etching the first metal layer and the pixel electrode layer to respectively form a source electrode and a drain electrode in the source electrode region and the drain electrode region of the first metal layer, and to form a plurality of pixel electrodes in the pixel electrode regions of the pixel electrode layer;
    removing the first photoresist layer, and removing the first metal layer which is on the pixel electrodes; and
    depositing a third insulation layer on the source electrode, the drain electrode, the pixel electrodes and the second insulation layer.

3. The manufacturing method of the FFS mode array substrate according to claim 2, wherein two doped regions which respectively correspond to the first through hole and the second through hole are disposed on the channel semiconductor layer, and the step of removing the second photoresist layer which is on the channel semiconductor layer includes: removing the second photoresist layer which is on the two doped regions of the channel semiconductor layer; doping the two doped regions to transform semiconductor of the doped regions into conductors; and then removing the remaining second photoresist layer on the channel semiconductor layer.

4. The manufacturing method of the FFS mode array substrate according to claim 1, wherein the second insulation layer and the third insulation layer both include silicon nitride or silica.

5. The manufacturing method of the FFS mode array substrate according to claim 1, wherein the channel semiconductor layer includes indium gallium zinc oxide.

6. The manufacturing method of the FFS mode array substrate according to claim 1, wherein the pixel electrode layer is an indium tin oxide transparent electrode layer or an indium zinc oxide transparent electrode layer, and a thickness of the pixel electrode layer ranges from 10 nm to 100 nm.

7. A FFS (Fringe Field Switching) mode array substrate, comprising:
    a glass substrate having a gate electrode thereon;
    a first insulation layer formed on the glass substrate and the gate electrode;
    a semiconductor layer formed on the first insulation layer, wherein the semiconductor layer includes a channel region and a common electrode region;
    the channel region of the semiconductor layer forms a channel semiconductor layer, and semiconductor of the common electrode region of the semiconductor layer is doped to form a common electrode layer; and
    a second insulation layer deposited on the channel semiconductor layer, the common electrode layer and the first insulation layer, wherein a first through hole and a second through hole exposing the channel semiconductor layer are formed in the second insulation layer.

8. The FFS mode array substrate according to claim 7, which further comprises:
    a pixel electrode layer deposited on the second insulation layer, wherein the pixel electrode layer has a plurality of pixel electrodes;
    a source electrode and a drain electrode formed on the pixel electrode layer; and
    a third insulation layer formed on the source electrode, the drain electrode, the pixel electrodes and the second insulation layer.

9. The FFS mode array substrate according to claim 7, wherein the channel semiconductor layer includes indium gallium zinc oxide.

10. The FFS mode array substrate according to claim 7, wherein the pixel electrode layer is an indium tin oxide transparent electrode layer or an indium zinc oxide transparent electrode layer, and a thickness of the pixel electrode layer ranges from 10 nm to 100 nm.

11. A FFS (Fringe Field Switching) mode array substrate, comprising:

a glass substrate having a gate electrode thereon;

a first insulation layer formed on the glass substrate and the gate electrode;

a semiconductor layer formed on the first insulation layer, wherein the semiconductor layer includes a channel region and a common electrode region;

the channel region of the semiconductor layer forms a channel semiconductor layer; and semiconductor of the common electrode region of the semiconductor layer is doped to form a common electrode layer;

a second insulation layer deposited on the channel semiconductor layer, the common electrode layer and the first insulation layer, wherein a first through hole and a second through hole exposing the channel semiconductor layer are formed in the second insulation layer;

a pixel electrode layer deposited on the second insulation layer, wherein the pixel electrode layer has a plurality of pixel electrodes;

a source electrode and a drain electrode formed on the pixel electrode layer; and a third insulation layer formed on the source electrode, the drain electrode, the pixel electrodes and the second insulation layer;

wherein the second insulation layer and the third insulation layer both include silicon nitride or silica.

\* \* \* \* \*